US012681096B2

(12) United States Patent
Song et al.

(10) Patent No.: US 12,681,096 B2
(45) Date of Patent: Jul. 14, 2026

(54) ONLINE DETECTION APPARATUS FOR STORAGE BATTERY

(71) Applicant: Alibaba (China) Co., Ltd., Hangzhou (CN)

(72) Inventors: Haipeng Song, Beijing (CN); Yuxiao Yan, Beijing (CN); Shushi Guo, Beijing (CN); Shanyuan Gao, Beijing (CN)

(73) Assignee: Alibaba (China) Co., Ltd., Hangzhou (CN)

( * ) Notice: Subject to any disclaimer, the term of this patent is extended or adjusted under 35 U.S.C. 154(b) by 680 days.

(21) Appl. No.: 18/054,722

(22) Filed: Nov. 11, 2022

(65) Prior Publication Data

US 2023/0160966 A1      May 25, 2023

(30) Foreign Application Priority Data

Nov. 19, 2021    (CN) .......................... 202111402016.1

(51) Int. Cl.
  *G01R 31/3842*      (2019.01)
  *G01R 31/379*      (2019.01)
(52) U.S. Cl.
  CPC ....... *G01R 31/3842* (2019.01); *G01R 31/379* (2019.01)
(58) Field of Classification Search
  CPC .......................... G01R 31/3842; G01R 31/379; G01R 31/386; G01R 31/385; G01R 31/40; G01R 31/382; G01R 31/389; H02J 7/0068; H02J 9/061; H02J 1/102; H02J 7/0013; H02J 7/007182
  See application file for complete search history.

(56) References Cited

U.S. PATENT DOCUMENTS

2022/0255345 A1*   8/2022   Liu ......................... H02J 9/068

FOREIGN PATENT DOCUMENTS

| CN | 2446707 | Y | 9/2001 |
|---|---|---|---|
| CN | 1527434 | A | 9/2004 |
| CN | 101453024 | A | 6/2009 |
| CN | 101702453 | A | 5/2010 |
| CN | 111722125 | A | 9/2020 |
| CN | 212380952 | U | * 1/2021 |

(Continued)

OTHER PUBLICATIONS

Chinese Search Report issued in corresponding Chinese Application No. 202111402016.1 (2 pages), Jun. 12, 2024.

(Continued)

*Primary Examiner* — Yossef Korang-Beheshti
(74) *Attorney, Agent, or Firm* — Finnegan, Henderson, Farabow, Garrett & Dunner, LLP

(57)          ABSTRACT

An online detection apparatus for a storage battery is provided. The battery, serving as standby power, is connected in parallel with a power supply in an electric device circuit. The apparatus includes a control unit, a discharge circuit, and a battery monitoring unit. After detecting a trigger event, the control unit instructs the discharge circuit to boost the battery voltage to match or exceed the power supply, initiating discharge. During this state, the battery monitoring unit evaluates the battery's discharge performance. Both the discharge circuit and monitoring unit are electrically coupled to the control unit.

9 Claims, 5 Drawing Sheets

(56) References Cited

FOREIGN PATENT DOCUMENTS

| CN | 112840522 | A |   | 5/2021 |
|----|-----------|---|---|--------|
| CN | 113533975 | A |   | 10/2021 |
| JP | H10341541 | A |   | 12/1998 |
| JP | 2013192388 | A | * | 9/2013 |
| KR | 20190073925 | A | * | 6/2019 |

OTHER PUBLICATIONS

Supplementary Chinese Search Report issued in corresponding Chinese Application No. 202111402016.1 (1 page), Oct. 31, 2024.

* cited by examiner

ONLINE DETECTION APPARATUS FOR STORAGE BATTERY

CROSS-REFERENCE TO RELATED APPLICATIONS

The disclosure claims the benefits of priority to Chinese Application No. 202111402016.1, filed Nov. 19, 2021, which is incorporated herein by reference in its entirety.

TECHNICAL FIELD

The present disclosure generally relates to the field of Internet, and in particular, to an online detection apparatus for a storage battery.

BACKGROUND

A lead-acid storage battery is a very important backup power supply in an electrical system of a data center, whose performance state has a great influence on functional stability of the data center. With the rapid development of the data center, an accumulation scale of the storage battery is huge, and the probability of failure increases significantly. The failure in the storage battery may bring great losses to the data center.

Currently, an offline dummy load detector is provided. When the detector is used, the storage battery is disconnected from a power supply system, and an offline dummy load is externally connected for charge and discharge detection. However, such offline detection leads to a failure of a backup power supply function of the storage battery and a waste of energy of the storage battery.

SUMMARY OF THE DISCLOSURE

Embodiments of the present disclosure provide an online detection apparatus for a storage battery. The storage battery is connected in parallel with a power supply in a working circuit of an electric device, and the storage battery is a standby power supply of the power supply. The apparatus includes a control unit comprising circuitry configured to send a boost enable instruction when detecting a detection trigger event of the storage battery; a discharge circuit connected in series with the storage battery and electrically coupled to the control unit, wherein the discharge circuit is configured to receive the boost enable instruction from the control unit and to control a voltage of the storage battery to be increased to greater than or equal to a voltage of the power supply according to the boost enable instruction to enable the storage battery to enter a discharge state; and a battery monitoring unit comprising circuitry electrically coupled to the control unit and configured to detect discharge performance of the storage battery when the storage battery enters the discharge state.

BRIEF DESCRIPTION OF THE DRAWINGS

Embodiments and various aspects of the present disclosure are illustrated in the following detailed description and the accompanying figures. Various features shown in the figures are not drawn to scale.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims. Particular aspects of the present disclosure are described in greater detail below. The terms and definitions provided herein control, if in conflict with terms and/or definitions incorporated by reference.

A lead-acid storage battery is a very important backup power supply in an electrical system of a data center, providing a performance state that has a great influence on functional stability of the data center. With the rapid development of the data center, an accumulation scale of the storage battery is huge, and the probability of failure increases significantly. The failure in the storage battery may bring great losses to the data center.

An offline dummy load detector is provided in the related art. When the detector is used, the storage battery may be disconnected from a power supply system, and an offline dummy load is externally connected for charge and discharge detection. However, such offline detection leads to a failure of a backup power supply function of the storage battery and a waste of energy of the storage battery.

In view of the above technical problems, in some embodiments of the present disclosure, an online detecting solution is provided. With this solution, an online testing can be performed on the storage battery. The technical solution according to the embodiments of the present disclosure is described in detail below with reference to the accompanying drawings.

Figure 1:
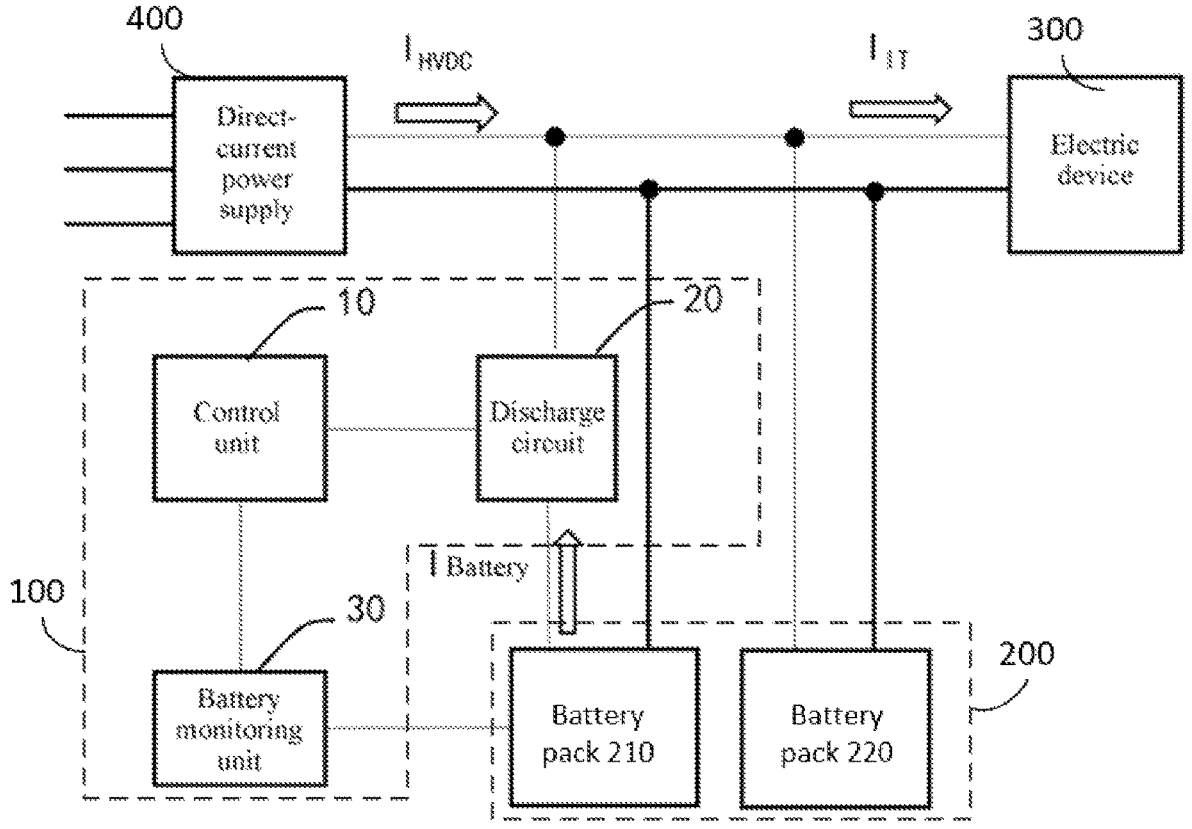
FIG. 1 is a schematic structural diagram of an exemplary online detection apparatus for a storage battery, according to some embodiments of the present disclosure.

FIG. 1 is a schematic structural diagram of an exemplary online detection apparatus 100 for a storage battery, according to some embodiments of the present disclosure. The apparatus 100 is configured to test a standby power supply in a power supply circuit of an electric device 300. The standby power supply can be a storage battery 200. The storage battery 200 is connected in parallel with the power supply 400 in the power supply circuit of the electric device. The electric device 300 may be realized as any electronic device or electrical device that needs to operate under external power supply and requires a standby power supply to guarantee the power supply, such as a server device, a switch device, a large-screen display device, or a medical device, which is not limited in the embodiments. As shown in FIG. 1, the apparatus 100 includes a control unit 10, a discharge circuit 20 and a battery monitoring unit 30. The discharge circuit 20 and the battery monitoring unit 30 are electrically connected to the control unit 10.

The control unit 10 comprises circuitry configured to send a boost enable instruction to the discharge circuit 20 when detecting a detection trigger event of the storage battery. The detection trigger event may be a user event. For example, a user may enter a detection request through a key on detection apparatus for the storage battery 200. If the control unit 10 identifies the detection request, a detection trigger event of the storage battery 200 is detected.

The discharge circuit 20 is connected in series with the storage battery 200 and configured to control a voltage of the storage battery to be increased to greater than or equal to a voltage of the power supply 400 according to the boost enable instruction of the control unit 10, so as to make the storage battery 200 enter a discharge state.

The battery monitoring unit 30 comprises circuitry configured to detect discharge performance of the storage battery 200 when the storage battery 200 enters the discharge state. In some embodiments, the battery monitoring unit 30 includes circuitries for data collection, data processing, and data monitoring. The circuitry for data collection is configured to collect voltage data for each battery and current data for each batter group in real time. In some embodiments, the circuitry for data collection can include voltage data collection circuit or current data collection circuit. For example, the current detection circuit can include Hall sensors. The circuitry for data processing is configured to analyze and process the collected data (e.g., the voltage data and the current data), to determine a status of the battery, for example, state, capacity, and etc. The circuitry for data monitoring is configured to monitoring the processed data. In some embodiments, the circuitry for data monitoring can include a monitoring screen for display the processed date, including basic information of the battery, battery capacity, alert information, etc. When the storage battery 200 is realized as a battery pack (a battery pack 210 and a battery pack 220 as shown in FIG. 1), the battery monitoring unit 30 may monitor performance of each battery in the battery pack. The battery monitoring unit 30 may monitor a capacity, internal resistance, and a temperature of each battery, as well as consistency between different batteries in the battery pack.

In some embodiments, the control unit 10 may be realized using various application-specific integrated circuits (ASIC), digital signal processors (DSPs), digital signal processing devices (DSPDs), programmable logic devices (PLDs), field-programmable gate arrays (FPGAs), micro central control elements, accelerators, microprocessors or other electronic elements, which is not limited in the present disclosure.

In the working circuit of the electric device, the power supply 400 may be realized as a high-voltage direct-current power supply (HVDC), as shown in FIG. 1. When the HVDC 400 is in a power supply state, the storage battery 200 is in a standby state. As shown in FIG. 1, after the discharge circuit 20 is connected in series with the storage battery 200, a voltage of the storage battery 200 may be increased, so that the voltage of the storage battery 200 is equal to or greater than a voltage of a direct-current power supply 400, enabling the storage battery 200 to enter a discharge state. In the discharge state, the battery monitoring unit 30 may test the storage battery 200 online.

As shown in FIG. 1, when the storage battery 200 is in the discharge state, a relation of currents may be: $I_{HVDC}+I_{battery}=I_{IT}$.

In some embodiments, the discharge circuit 20 may be realized based on at least one DC-DC boost module. When the discharge circuit is realized based on a plurality of DC-DC boost modules, the plurality of DC-DC boost modules may be connected in parallel and then connected in series to the working circuit of the electric device 300.

Figure 2:
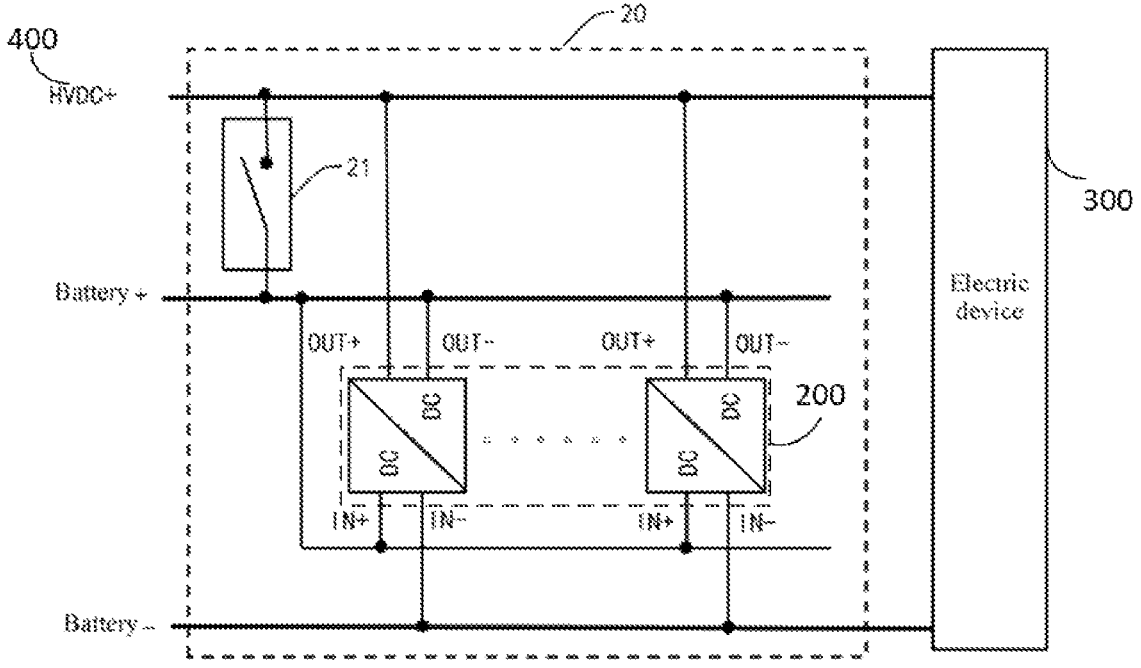
FIG. 2 is a schematic diagram illustrating an exemplary connection of a discharge circuit, according to some embodiments of the present disclosure.

FIG. 2 is a schematic diagram illustrating an exemplary connection of a discharge circuit 20, according to some embodiments of the present disclosure. In some embodiments, as shown in FIG. 2, the power supply 400 is realized as an HVDC. The discharge circuit 20 has a positive output terminal (OUT+) connected to a series connection path between a positive electrode of the power supply (HVDC+) and the electric device 300, a positive input terminal (IN+) and a negative output terminal (OUT−) that are connected to a positive electrode of the storage battery (battery+), and a negative input terminal (IN−) connected to a series connection path between a negative electrode of the storage battery (battery−) and the electric device 300. A first controlled switch component 21 is provided between the positive output terminal (OUT+) and the positive input terminal (IN+) and the negative output terminal (OUT−).

The first controlled switch component 21 may be configured to connect the positive output terminal (OUT+) to the positive input terminal (IN+) and the negative output terminal (OUT−) according to the boost enable instruction sent by the control unit 10. That is, when online testing of the storage battery 200 is not enabled, the first controlled switch component 21 is in an off state, and the storage battery 200 is in a standby state. When online testing of the storage battery 200 is enabled, the first controlled switch component 21 is in an on state, the positive output terminal (OUT+) is connected to the positive input terminal (IN+) and the negative output terminal (OUT−), so as to connect the storage battery 200 to the working circuit of the electric device 300. When the discharge circuit 20 controls the storage battery 200 to be boosted, the storage battery 200 may enter the discharge state for discharge if the voltage of the storage battery 200 is greater than or equal to a voltage of the power supply in the working circuit of the electric device 300.

In this example, when a standby storage battery of the electric device is detected, a discharge circuit in a storage battery detector may be connected in series to the working circuit of the electric device. The storage battery is caused to enter the discharge state by online boosting, and the storage battery is detected in the discharge state. In this example, the storage battery does not need to be removed from the working circuit of the electric device, and an online testing can be performed on the storage battery while retaining the function of the storage battery as a standby power supply. During the testing, the storage battery may supply power to the electric device in the discharge state, which ensures full use of energy of the storage battery and reduces a waste of the energy. In addition, the storage battery may be controlled to stop discharging when meeting a discharge cut-off condition, so that the power supply can resume supplying power to the electric device, thereby reducing the influence of online testing of the storage battery on the electric device.

After deep discharge of the storage battery 200, the voltage gradually decreases, and the control unit 10 may control the storage battery 200 to stop discharging. In some embodiments, the control unit 10 is further configured to output a discharge cut-off instruction to the discharge circuit 20 when the storage battery 200 meets a discharge cut-off condition. The first controlled switch component 21 in the discharge circuit 20 may be configured to disconnect the positive output terminal (OUT+) from the positive input terminal (IN+) and the negative output terminal (OUT−) according to the discharge cut-off instruction. After the storage battery 200 stops discharging, the power supply 400 may continue to supply power to the electric device 300.

In some embodiments, the discharge cut-off condition may be that the voltage of the storage battery is decreased to a voltage threshold or the storage battery consumes a capacity of electric power. The capacity of electric power consumed may be a percentage of the electric power of the storage battery, for example, 80%, 75%, or 60%, so as to perform deep discharge testing on the storage battery. The control unit 10 may be specifically configured to output the discharge cut-off instruction to the discharge circuit 20 if the voltage of the storage battery is decreased to a voltage threshold or the storage battery consumes a capacity of electric power, after the storage battery enters the discharge state.

During the testing, the storage battery may be controlled to stop discharging when meeting the discharge cut-off condition, so that the power supply can resume supplying power to the electric device, thereby reducing the influence of online testing of the storage battery on the electric device.

Figure 3:
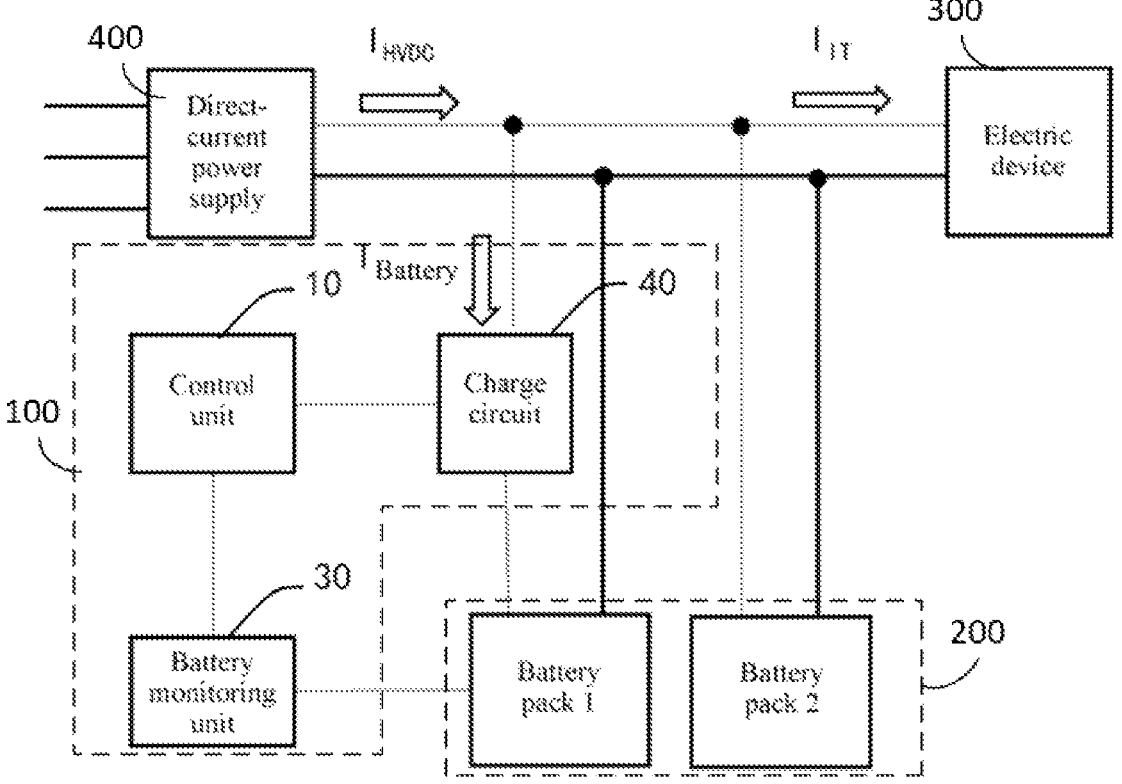
FIG. 3 is a schematic structural diagram of another exemplary online detection apparatus for a storage battery, according to some embodiments of the present disclosure.

FIG. 3 is a schematic structural diagram of another exemplary online detection apparatus for a storage battery, according to some embodiments of the present disclosure. In some embodiments, as shown in FIG. 3, the online detection apparatus 100 for the storage battery 200 may further include a charge circuit 40 which is connected to the control unit 10. The charge circuit 40 is connected in series with the storage battery 200 and configured to charge the storage battery 200 under the control of the control unit 10. In some embodiments, the control unit 10 is further configured to output a charge enable instruction to the charge circuit 40 when the storage battery 200 meets the discharge cut-off condition.

The charge circuit 40 is configured to control the storage battery 200 to enter a charge state according to the charge enable instruction of the control unit 10, so that the power supply 400 charges the storage battery 200. In this example, the battery monitoring unit 30 may be further configured to detect charge performance of the storage battery 200 when the storage battery 200 enters the discharge state. For example, the charge performance may include charge time, a charging temperature, a charge rate, and the like of each battery in a battery pack corresponding to the storage battery 200, which can be monitored.

Still based on an example in which the power supply is realized as an HVDC, as shown in FIG. 3, when the storage battery 200 is in the charge state, the relation of currents may be: $I_{HVDC} = I_{IT} + I_{battery}$.

In some embodiments, the charge circuit 40 may be realized based on at least one DC-DC boost module. When the charge circuit 40 is realized based on a plurality of DC-DC boost modules, the plurality of DC-DC boost modules may be connected in parallel and then connected in series to the working circuit of the electric device 300.

Figure 4:
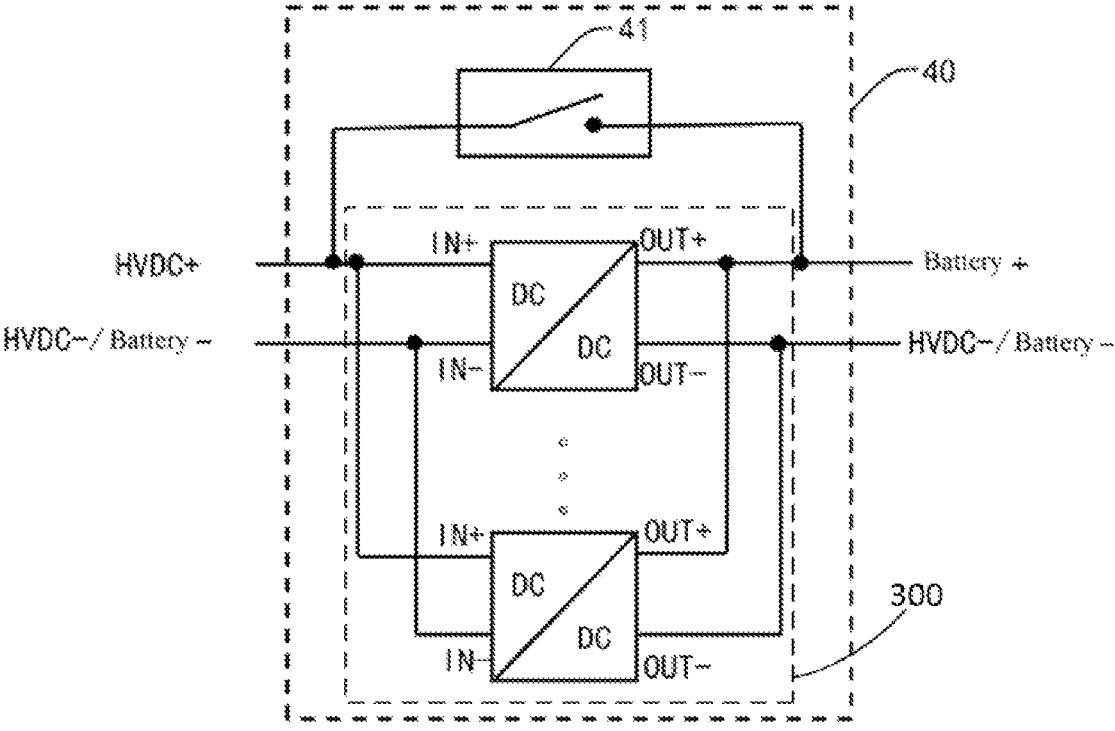
FIG. 4 is a schematic diagram illustrating an exemplary connection of a charge circuit, according to some embodiments of the present disclosure.

FIG. 4 is a schematic diagram illustrating an exemplary connection of a charge circuit 40, according to some embodiments of the present disclosure. In some embodiments, as shown in FIG. 4, the charge circuit 40 has a positive input terminal (IN+) connected to the positive electrode of the power supply (HVDC+), a positive output terminal (OUT+) connected to the positive electrode of the storage battery (battery+), and a negative input terminal (IN−) and a negative output terminal (OUT−) that are connected to the negative electrode of the storage battery (battery−) and a negative electrode of the power supply (HVDC−). A second controlled switch component 41 is provided between the positive input terminal (IN+) and the positive output terminal (OUT+). The second controlled switch component 41 is configured to connect the positive output terminal (OUT+) of the charge circuit to the positive input terminal (IN+) of the charge circuit 40 according to the charge enable instruction.

When the storage battery 200 is not charged, the second controlled switch component 41 is in an off state. When the storage battery 200 is charged, the second controlled switch component 41 is in an on state, and the positive output terminal (OUT+) of the charge circuit 40 and the positive input terminal (IN+) of the charge circuit 40 are turned on, so that the power supply 400 charges the storage battery 200.

Based on the above embodiments, the charge state may be automatically switched to at the end of the discharge process, and an original working circuit of the electric device may be resumed after the storage battery is fully charged. When the storage battery includes a plurality of groups of batteries, discharge testing may be performed on each group of batteries, and any group of batteries can be charged in time after the discharge testing, which can prevent the impact caused by voltage drop of the plurality of groups of batteries and form good circuit protection.

In some embodiments, the control unit 10 may control the charge circuit 40 to charge the storage battery 200 by stagewise charging, so as to prevent high-current impact on the storage battery 200.

In some embodiments, the control unit 10 may output a current-limiting voltage-regulating charge instruction to the charge circuit 40 when the storage battery 200 meets the discharge cut-off condition. The charge circuit 40 may perform current-limiting voltage-regulating charge on the storage battery 200 according to the current-limiting voltage-regulating charge instruction. In a current-limiting charge stage, a charge voltage slowly increases, and a current-limiting size of a current may be determined according to charge characteristics of the storage battery 200. For example, if the characteristics of the storage battery 200 determine that an upper limit of a charge current of the storage battery is 0.1 C, in a current-limiting voltage-regulating charge stage, the current may be controlled to take 0.1 C as the upper limit to perform current-limiting charge. C refers to a battery capacity unit of a valve-regulated lead-acid (VRLA) battery. It is known that generally, VRLA battery charge current is 0.1 C. For example, for a 400 Ah battery, 1 C refers to 40 A.

As the current-limiting voltage-regulating charge proceeds, the voltage of the storage battery 200 constantly increases. The control unit 10 may output a constant-voltage equalizing charge instruction to the charge circuit 40 when the voltage of the storage battery 200 reaches an equalizing charge voltage. The charge circuit 40 may perform constant-voltage charge on the storage battery 200 according to the constant-voltage charge instruction. In a constant-voltage charge stage, the charge voltage is an equalizing charge voltage, and the charge current may perform current-limiting charge according to a charge current upper limit of the storage battery.

The control unit 10 may output a float charge instruction to the charge circuit 40 after a preset time length of equalizing charge. The charge circuit 40 may perform float charge on the storage battery according to the float charge instruction. That is, upon completion of the equalizing charge, a float charge voltage of the storage battery is resumed, and the storage battery enters a float charge state.

In this example, the online detection apparatus for the storage battery may charge the storage battery by using a plurality of charge stages after the voltage of the storage battery decreases, which can form good protection over the storage battery during the charge.

Figure 5:
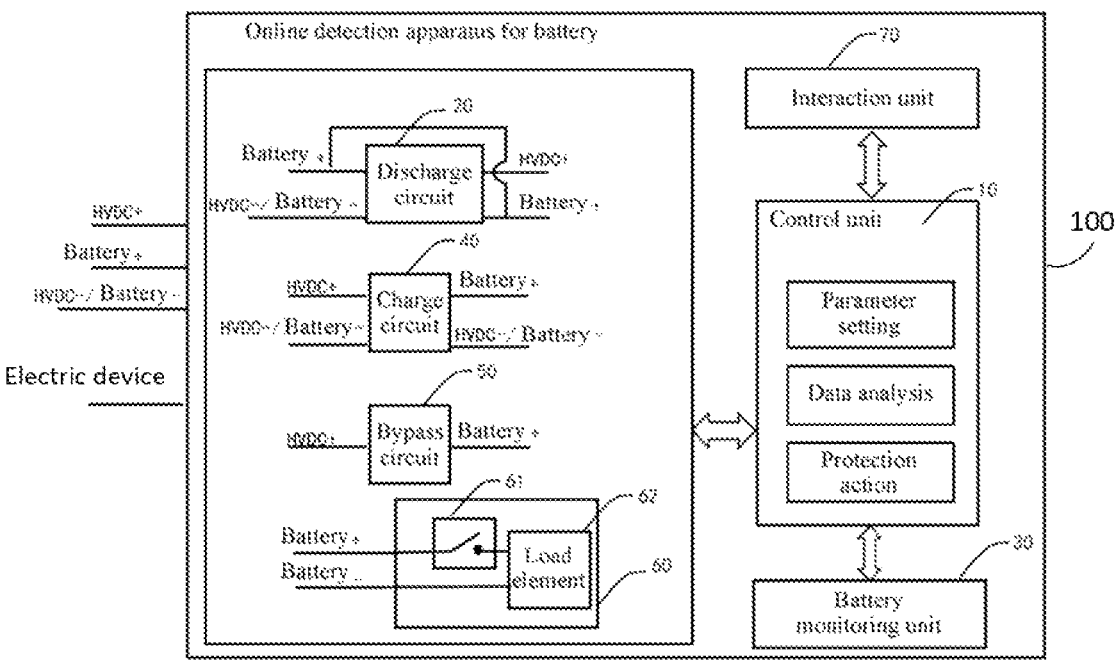
FIG. 5 is a schematic structural diagram of an online detection apparatus for a storage battery, according to some embodiments of the present disclosure.

FIG. 5 is a schematic structural diagram of an online detection apparatus for a storage battery, according to some embodiments of the present disclosure. In some embodiments, as shown in FIG. 5, the online detection apparatus 100 for the storage battery 200 further includes a bypass module 50 electrically connected to the control unit 10. The bypass module 50 comprises circuitry connected in series between the storage battery and the electric device. As shown in FIG. 5, the bypass module 50 has one end connected to the positive electrode of the storage battery (battery+) and the other end connected between the positive electrode of the power supply (HVDC+) and the electric device.

In this example, the control unit 10 is further configured to detect a state of the power supply in the working circuit of the electric device, and send a power enable instruction to the bypass module 50 when detecting that the power supply is abnormal (e.g., a low voltage, an unstable voltage, or a power outage). Therefore, the bypass module 50 can isolate the abnormal power supply, and the battery can continue to power the electric device.

The bypass module 50 may be configured to connect a circuit between the electric device and the storage battery according to the power enable instruction of the control unit 10, so as to cause the storage battery to supply power to the electric device. In some embodiments, the bypass module 50 may be mainly formed by a controlled switch component and a rated load line. The controlled switch component may remain off when a power supply instruction is not received. When the power supply instruction is received, the controlled switch component can quickly enter a short-circuit state, regardless of whether the storage battery is in a discharge or equalizing charge state, so that the storage battery is connected in parallel to the electric device to provide a backup power supply.

In some embodiments, the bypass module 50 may include power semiconductor device. For example, in some embodiments, the bypass module 50 includes Insulated Gate Bipolar Transistors (IGBT).

In some embodiments, as shown in FIG. 5, the online detection apparatus 100 for the storage battery further includes an external load circuit 60 electrically connected to the control unit 10. The control unit 10 is further configured to send a load enable instruction to the external load circuit when a load rate of the electric device is less than a set load rate threshold. The external load circuit 60 is configured to increase a load of the storage battery according to the load enable instruction. The load rate threshold may be a percentage of the load, for example, 20%, 25%, or 30% of the load, which is not limited in the present disclosure.

In some embodiments, as shown in FIG. 5, the external load circuit 60 may include a third controlled switch component 61 and a load element 62 connected in series. The load element 62, after being connected in series with the third controlled switch component 61, is connected in parallel to two ends of the storage battery. After the third controlled switch component 61 is turned on, a total load of the storage battery is a sum of loads of electronic elements and the load element 62.

In this example, in the case of a small load of the electric device, deep discharge testing on the storage battery may be realized to improve testing efficiency.

In some embodiments, as shown in FIG. 5, the online detection apparatus for the storage battery may further include an interaction unit 70 comprises circuitry connected to the control unit 10. In some embodiments, the interaction unit 70 may be realized in various forms, for example, realized as an interaction unit with an electronic touch screen, or an interaction unit with a specific physical key, or an interaction unit with a voice recording module, which is not limited in the present disclosure.

The interaction unit 70 is configured to acquire test parameters of the storage battery and send the test parameters to the control unit 10. The control unit 10 may realize parameter setting through the test parameters sent by the interaction unit 70.

The test parameters include at least one of magnitude of a discharge current, a voltage of a battery cell, a charge current-limiting size, an upper limit of boost, a capacity of the battery cell, and a quantity of battery cells included in the storage battery. In this implementation, the control unit 10 is specifically configured to send a corresponding test control instruction according to the test parameters.

Based on the interaction unit 70, the user may input a test requirement for the storage battery, so that the detection apparatus for the storage battery completes testing under the test requirement of the user. For example, when the user inputs a capacity of the storage battery through the interaction unit 70, the control unit 10 may determine according to the capacity of the battery when discharge cut-off time is reached. For example, when the user inputs the magnitude of the discharge current through the interaction unit 70, the control unit 10 may control the storage battery to discharge according to the magnitude of the discharge current as instructed by the user. In some embodiments, the control unit 10 may send, according to the upper limit of boost inputted by the user through the interaction unit 70, an instruction of boosting the storage battery according to the upper limit of boost to the discharge circuit 20. Other components in FIG. 5 are the same as those described above with reference to FIGS. 1-4, which will not repeat herein.

Based on the above embodiments, in addition to a parameter setting function, the control unit 10 may also include a data analysis function. Specifically, the battery monitoring unit 30, after collecting voltage data of the storage battery, may send the collected voltage data to the control unit 10. The control unit 10 may analyze performance of the storage battery according to the received voltage data, and may draw a performance curve of the storage battery according to analysis results.

Figure 6:
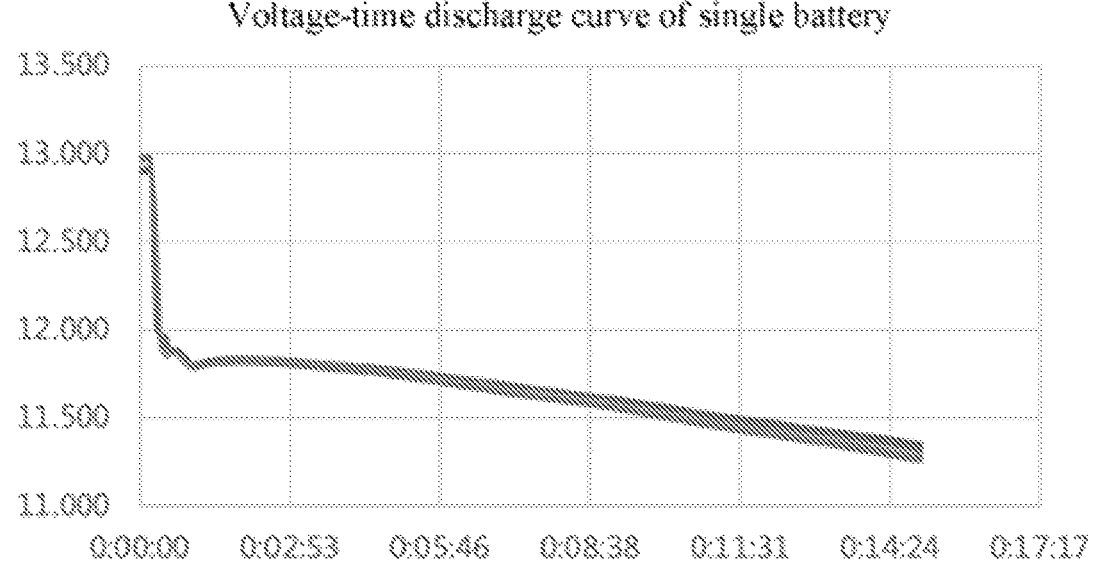
FIG. 6 is a schematic diagram of an exemplary discharge performance curve of a storage battery outputted by an online detection apparatus, according to some embodiments of the present disclosure.

FIG. 6 is a schematic diagram of a discharge performance curve of a storage battery outputted by a battery detection apparatus, according to some embodiments of the present disclosure. As shown in FIG. 6, when more than 80% of electric power of a group of batteries has been discharged, voltage and current curves of a battery pack are smooth without burr points, and a cell cut-off voltage is greater than a design value of 1.75V. The group of batteries meets usage requirements.

The detection apparatus for the storage battery according to the above embodiments may be packaged as a storage battery detector. A quick-connect terminal may be preset on the storage battery detector, and configured to connect a discharge test instrument, which supports plug and play and is easy to operate. To facilitate the operation, a battery switch box may be further provided on the storage battery detector, and an isolation switch is provided between a positive electrode and a negative electrode of the battery switch box, so as to improve operation security. The storage battery detector may be designed with a roller at the bottom and a power supply module supporting hot swap, so as to be conveniently moved in a place where the electric device is located.

The online detection apparatus for the storage battery according to the above embodiments of the present disclosure is applicable to a variety of test scenarios of the storage battery. For example, in a typical scenario, a plurality of server devices are deployed in a data center. Performance testing needs to be periodically performed on storage batteries which serve as important backup power supplies of servers. Based on the embodiments of the present disclosure, when the backup power supplies of the servers are periodically tested, the online detection apparatus for the storage battery may be connected in series in a working circuit of each server, and the discharge circuit in the online detection apparatus for the storage battery controls the backup power supplies of the servers to be boosted to enter a discharge state. After the discharge state is entered, the online detection apparatus for the storage battery may test performance of the backup power supplies. Upon completion of the testing, the charge circuit in the online detection apparatus for the storage battery may control direct-current power supplies connected to the servers to charge the backup power supplies.

In the above testing process, the online detection apparatus for the storage battery may realize high-current impact and deep discharge testing, which can more truly verify actual performance of batteries. Electric power discharged by the storage batteries is available to the server devices, reducing a waste of energy caused by the testing process. In addition, the storage batteries do not need to be removed from the working circuits of the server devices based on online testing, which ensures that functions of the backup power supplies remain effective, and backup power supplies may be provided at any time based on the bypass module, providing higher redundancy reliability.

In some embodiments, a non-transitory computer-readable storage medium including instructions is also provided, and the instructions may be executed by a device, for performing the above-described methods. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same. The device may include one or more processors (CPUs), an input/output interface, a network interface, and/or a memory.

It should be noted that, the relational terms herein such as "first" and "second" are used only to differentiate an entity or operation from another entity or operation, and do not require or imply any actual relationship or sequence between these entities or operations. Moreover, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items.

As used herein, unless specifically stated otherwise, the term "or" encompasses all possible combinations, except where infeasible. For example, if it is stated that a database may include A or B, then, unless specifically stated otherwise or infeasible, the database may include A, or B, or A and B. As a second example, if it is stated that a database may include A, B, or C, then, unless specifically stated otherwise or infeasible, the database may include A, or B, or C, or A and B, or A and C, or B and C, or A and B and C.

It is appreciated that the above-described embodiments can be implemented by hardware, or software (program codes), or a combination of hardware and software. If implemented by software, it may be stored in the above-described computer-readable media. The software, when executed by the processor can perform the disclosed methods. The computing units and other functional units described in this disclosure can be implemented by hardware, or software, or a combination of hardware and software. One of ordinary skill in the art will also understand that multiple ones of the above-described modules/units may be combined as one module/unit, and each of the above-described modules/units may be further divided into a plurality of sub-modules/sub-units.

In the foregoing specification, embodiments have been described with reference to numerous specific details that can vary from implementation to implementation. Certain adaptations and modifications of the described embodiments can be made. Other embodiments can be apparent to those skilled in the art from consideration of the specification and practice of the invention disclosed herein. It is intended that the specification and examples be considered as exemplary only, with a true scope and spirit of the invention being indicated by the following claims. It is also intended that the sequence of steps shown in figures are only for illustrative purposes and are not intended to be limited to any particular sequence of steps. As such, those skilled in the art can appreciate that these steps can be performed in a different order while implementing the same method.

In the drawings and specification, there have been disclosed exemplary embodiments. However, many variations and modifications can be made to these embodiments. Accordingly, although specific terms are employed, they are used in a generic and descriptive sense only and not for purposes of limitation.

What is claimed is:

1. An online detection apparatus for a storage battery, the storage battery being connected in parallel with a power supply in a working circuit of an electric device and being a standby power supply of the power supply, wherein the apparatus comprises:

a control unit comprising circuitry configured to send boost enable instruction when detecting a detection trigger event of the storage battery;

a discharge circuit connected in series with the storage battery and electrically coupled to the control unit, wherein the discharge circuit is configured to receive the boost enable instruction from the control unit and to control a voltage of the storage battery to be increased to greater than or equal to a voltage of the power supply according to the boost enable instruction to enable the storage battery to enter a discharge state, wherein the discharge unit further comprises:

a positive output terminal connected to a series connection path between a positive electrode of the power supply and the electric device, a positive input terminal and a negative output terminal connected to a positive electrode of the storage battery, a negative input terminal connected to a series connection path between a negative electrode of the storage battery and the electric device, and a first controlled switch component provided between the positive output terminal and the positive input terminal and the negative output terminal, the first controlled switch component being configured to connect the positive output terminal of the discharge circuit to the positive input terminal and the negative output terminal of the discharge circuit according to the boost enable instruction; and a battery monitoring unit comprising circuitry electrically coupled to the control unit and configured to detect discharge performance of the storage battery when the storage battery enters the discharge state.

2. The apparatus according to claim 1, wherein the control unit is further configured to output a discharge cut-off instruction to the discharge circuit when the storage battery meets a discharge cut-off condition; and the first controlled switch component is further configured to disconnect the positive output terminal of the discharge circuit from the positive input terminal and the negative output terminal of the discharge circuit according to the discharge cut-off instruction.

3. The apparatus according to claim 2, wherein after the storage battery enters the discharge state, the control unit is further configured to output the discharge cut-off instruction to the discharge circuit when the voltage of the storage battery is decreased to a voltage threshold or the storage battery consumes a battery charge level of a capacity.

4. The apparatus according to claim 2, further comprising a charge circuit connected to the control unit; wherein the control unit is further configured to output a charge enable instruction to the charge circuit when the storage battery meets the discharge cut-off condition;

the charge circuit is connected in series with the storage battery and configured to control the storage battery to enter a charge state according to the charge enable instruction of the control unit; and the battery monitoring unit is further configured to detect charge performance of the storage battery when the storage battery enters the discharge state.

5. The apparatus according to claim 4, wherein the charge circuit comprises:

a positive input terminal connected to the positive electrode of the power supply;

a positive output terminal connected to the positive electrode of the storage battery;

a negative input terminal and a negative output terminal are connected to the negative electrode of the storage battery and a negative electrode of the power supply; and a second controlled switch component provided between the positive input terminal and the positive output terminal, the second controlled switch component being configured to connect the positive output terminal of the charge circuit to the positive input terminal of the charge circuit according to the charge enable instruction.

6. The apparatus according to claim 4, wherein the control unit is further configured to: output a current-limiting voltage-regulating charge instruction to the charge circuit when the storage battery meets the discharge cut-off condition;

output a constant-voltage equalizing charge instruction to the charge circuit when the voltage of the storage battery reaches an equalizing charge voltage; and output a float charge instruction to the charge circuit after a preset time length of equalizing charge.

7. The apparatus according to claim 1, further comprising a bypass module comprising circuitry electrically connected to the control unit and connected in series between the storage battery and the electric device; wherein the control unit is further configured to send a power enable instruction to the bypass module when detecting that the power supply is abnormal; and the bypass module is configured to connect a circuit between the electric device and the storage battery according to the power enable instruction of the control unit, so as to cause the storage battery to supply power to the electric device.

8. The apparatus according to claim 1, further comprising an external load circuit electrically connected to the control unit and connected in parallel with the electric device; wherein the control unit is further configured to send a load enable instruction to the external load circuit when a load rate of the electric device is less than a set load rate threshold; and the external load circuit is configured to increase a load of the storage battery according to the load enable instruction.

9. The apparatus according to claim 1, further comprising an interaction unit comprising circuitry connected to the control unit and configured to acquire test parameters of the storage battery and send the test parameters to the control unit, wherein the test parameters comprise at least one of magnitude of a discharge current, a voltage of a battery cell, a charge current-limiting size, an upper limit of boost, a capacity of the battery cell, or a quantity of battery cells comprised in the storage battery; and the control unit is further configured to send a corresponding test control instruction according to the test parameters.

* * * * *